(12) United States Patent
Han et al.

(10) Patent No.: US 8,383,494 B2
(45) Date of Patent: Feb. 26, 2013

(54) METHOD FOR FORMING BUFFER LAYER FOR GAN SINGLE CRYSTAL

(75) Inventors: Kyung Seob Han, Gunpo-si (KR); Jeong Heo, Suwon-si (KR); Hyeong Jun Kim, Seoul (KR); Seung Kil Lee, Wonju-si (KR)

(73) Assignee: Grand Tech Co., Ltd, Siheung-Si, Gyeonggi-Do (KR)

( * ) Notice: Subject to any disclaimer, the term of this patent is extended or adjusted under 35 U.S.C. 154(b) by 395 days.

(21) Appl. No.: 12/433,949

(22) Filed: May 1, 2009

(65) Prior Publication Data

US 2009/0275190 A1    Nov. 5, 2009

(30) Foreign Application Priority Data

May 2, 2008   (KR) ................. 10-2008-0041345

(51) Int. Cl.
*H01L 21/36* (2006.01)
*C30B 23/00* (2006.01)
*C30B 29/38* (2006.01)

(52) U.S. Cl. ...... 438/481; 117/952; 117/84; 257/E21.09

(58) Field of Classification Search .................. None
See application file for complete search history.

(56) References Cited

U.S. PATENT DOCUMENTS

| 6,350,666 | B2* | 2/2002 | Kryliouk ................... 438/604 |
| 2007/0120141 | A1* | 5/2007 | Moustakas et al. ........ 257/103 |
| 2009/0057835 | A1* | 3/2009 | Yao et al. .................. 257/615 |
| 2009/0278233 | A1* | 11/2009 | Pinnington et al. ........ 257/615 |
| 2011/0042682 | A1* | 2/2011 | Preble et al. ................. 257/76 |

FOREIGN PATENT DOCUMENTS

KR    2004055071    * 6/2004

* cited by examiner

*Primary Examiner* — Melvin C Mayes
*Assistant Examiner* — Bijay Saha
(74) *Attorney, Agent, or Firm* — Kile Park Goekjian Reed & McManus PLLC

(57) ABSTRACT

Disclosed is a method for forming a buffer layer for growing gallium nitride single crystals on a sapphire substrate using hydride vapor phase epitaxy (HVPE), wherein the buffer layer is formed in the form of a doped vertical gallium nitride (GaN) single crystal film with a nanoporosity of 0.10 to 0.15 μm on the sapphire substrate by reacting HCl and $NH_3$ as a Group III/V mix gas.

The nanoporous buffer layer interposed on the interface between the sapphire substrate and gallium nitride reduces tensile stress generated by the difference in thermal expansion coefficient between gallium nitride and the sapphire substrate, enables growth of the gallium nitride layer to a thickness of 1 micrometer (μm) to several millimeters (mm) without causing cracks, and reduces the lattice constant difference to improve crystallinity.

3 Claims, 1 Drawing Sheet

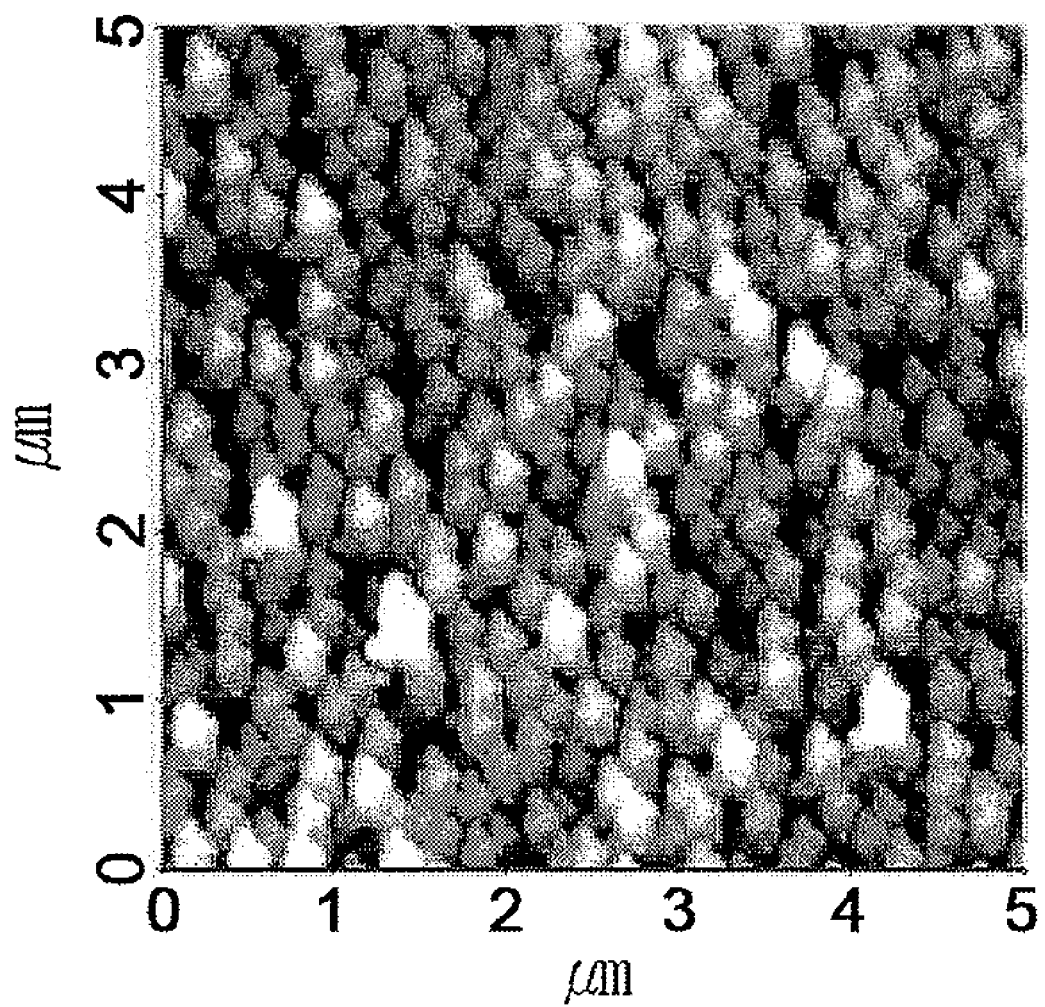

METHOD FOR FORMING BUFFER LAYER FOR GAN SINGLE CRYSTAL

BACKGROUND OF THE INVENTION

1. Field of the Invention

The present invention relates to a method for forming a buffer layer to grow gallium nitride single crystals, and more particularly to a method for forming a buffer layer to grow gallium nitride single crystals, comprising forming a buffer layer as a nanoporous vertical layer on the interface between a sapphire substrate and gallium nitride, to reduce dislocation defect density.

2. Description of the Related Art

The rapid development of information and communication technologies has brought about rapid development of communication technologies to transfer ultrahigh-speed and mass-storage signals. In accordance with increasing demand for personal cellular phones, satellite communications, military radars and communication repeaters of wireless-communication techniques, the demand for high-speed and high-power electric devices requiring micrometer and millimeter wave bandwidth of ultrahigh-speed information and communication systems gradually increases.

In particular, Group III-V nitride-based compound semiconductors composed of GaN, GaInN mixed crystals, AlGaInN mixed crystals, AlGaN mixed crystals, etc., are direct-transition semiconductor materials that have superior physical properties such as large energy gap, high thermal chemical stability and high electric saturation speed, and are widely utilized in a variety of applications including short/long wavelength ranges of photodiodes as well as high-frequency and high-power electric devices.

Gallium nitride (GaN)-based single crystal semiconductors are composed of single crystalline gallium nitride (GaN) films formed on a hetero-substrate by vapor-phase growth methods such as organic metal chemical vapor deposition (MOCVD), molecular beam epitaxy (MBE), or hydride vapor phase epitaxy (HVPE). Of these, HVPE is suited to growing thick films with a size of several to several hundred nanometers ($\mu$m). In particular, the HVPE method enables several millimeters of bulk growth, depending on substrate conditions.

Meanwhile, a sapphire ($Al_2O_3$) substrate which has a hexagonal system, e.g., gallium nitride, is inexpensive and stable at high temperatures, and is generally used as the hetero-substrate, on which gallium nitride single crystals are grown. Sapphire is useful for growing gallium nitride thin films. However, sapphire is unsuitable for use in growing gallium nitride thick films in that the large difference (about 16%) in lattice constant between sapphire and gallium nitride, and the large difference (about 36%) in thermal expansion coefficient therebetween causes generation of inner strain in the nitride layer and dislocation of the single crystal hetero-substrate.

Such a dislocation phenomenon progresses in a crystal growth direction and threading dislocation is thus propagated onto the growth surface, thus causing crystallinity of nitride semiconductor substrates. As a result, electrical properties are deteriorated and the substrate is warped due to the generated inner strain. In particular, when crystals are grown on the hetero-substrate, the presence of the inner strain causes the substrate to warp in the process of cooling. The warp is still present on the free standing plate, in which the hetero-substrate is removed. Accordingly, when a layer-structure for devices is grown by polishing the warped substrate, uniform composition distribution cannot be obtained and lithographic processes cannot be thus evenly performed. For this reason, growth of layer-structures for devices disadvantageously causes a considerably low process yield. In an attempt to address the dislocation defect between sapphire/gallium nitride single crystal laminates, technologies such as epitaxial lateral overgrowth (ELOG), pendeo-epitaxy, similar thereto and void-assisted separation (VAS) to vertically grow gallium nitride were developed and have been employed. Such a technology is a method wherein a GaN thin film is primarily grown on a sapphire substrate, is then patterned using an inorganic material or a mask material such as $SiO_2$, Sn or W, and is subjected to exposure and developing processes, and GaN is secondarily grown thereon.

However, the use of these methods does not enable the dislocation defect density between the sapphire substrate and the gallium nitride layer to be decreased to $5 \times 10^{5-6}/cm^2$ or less. In addition, these methods involve use of artificial masks, inducing stress into the growth film, thus allowing the film to be warped and cracked, when crystals are grown to a thickness of 100 $\mu$m or higher, and finally causing the film to be broken. For this reason, high-quality gallium nitride single crystal substrates having a thickness of 350 $\mu$m or higher cannot be secured.

Accordingly, there is a demand in the art for methods for growing high-quality gallium nitride single crystal substrates that reduce tensile stress generated by the difference in thermal expansion coefficient between gallium nitride and the sapphire substrate, grow a gallium nitride layer to a thickness of 1 micrometer ($\mu$m) to several millimeters (mm) suitable for commercialization without causing cracks, and reduce the lattice constant difference to improve crystallinity.

SUMMARY OF THE INVENTION

Therefore, the present invention has been made in view of the above problems, and it is an object of the present invention to provide a method for forming a buffer layer to grow high-quality gallium nitride single crystals, the method comprising forming a buffer layer as a nanoporous vertical layer on the interface between a sapphire substrate and gallium nitride, to reduce tensile stress generated by the difference in thermal expansion coefficient between gallium nitride and the sapphire substrate and thus grow a gallium nitride layer to a thickness of 1 micrometer ($\mu$m) to several millimeters (mm) without causing cracks, and to reduce the lattice constant difference and thus improve crystallinity.

It is another object of the present invention to provide a high-quality bulk free standing gallium nitride single crystal substrate provided with the buffer layer and having a thickness of 300 $\mu$m to 550 $\mu$m suitable for commercialization.

In accordance with the present invention, the above and other objects can be accomplished by the provision of a method for forming a buffer layer for growing gallium nitride single crystals on a sapphire substrate using hydride vapor phase epitaxy (HVPE), wherein the buffer layer is formed in the form of a doped vertical gallium nitride (GaN) single crystal film with a nanoporosity of 0.10 to 0.15 $\mu$m on the sapphire substrate by reacting HCl and $NH_3$ as a Group III/V mix gas.

The method may include: treating HCl and $NH_3$ as the mix gas in a ratio of 1:50 to 1:280 to grow a film to a thickness of 1 to 5 $\mu$m; treating HCl and $NH_3$ as the mix gas in a ratio of 1:70 to 1:150 to grow a film to a thickness of 1 to 10 $\mu$m, thereby forming a nano-porous vertical film with nanoporosity of 0.10 to 0.15 $\mu$m; and repeating the previous second step to form a film to a thickness of 1 to 5 $\mu$m.

The buffer layer may be formed to a total thickness of 5 to 25 $\mu$m.

The method may further include treating the sapphire substrate with GaN at a temperature of 500 to 1,200° C., prior to the formation of the buffer layer.

The method may further include dipping the substrate in phosphoric acid ($H_3PO_4$) at 50 to 150° C. for 10 to 330 seconds, after the formation of the buffer layer.

In accordance with another aspect of the present invention, provided is a buffer layer formed on a sapphire substrate in the form of a vertical gallium nitride film with nanoporosity of 0.10 to 0.15 μm.

In accordance with another aspect of the present invention, provided is a gallium nitride single crystal substrate including the buffer layer.

BRIEF DESCRIPTION OF THE DRAWINGS

The above and other objects, features and other advantages of the present invention will be more clearly understood from the following detailed description taken in conjunction with the accompanying drawings, in which:

FIG. 1 is an optical microscope image of a buffer layer according to an embodiment of the present invention.

DETAILED DESCRIPTION OF THE INVENTION

Hereinafter, the present invention will be described in more detail.

In one aspect, the present invention is directed to a method for forming a buffer layer on a sapphire substrate in the form of a nano-porous vertical film with nanoporosity of 0.10 to 0.15 μm using hydride vapor phase epitaxy (HVPE) in order to grow a high-quality gallium nitride film which cannot be realized by conventional ELOG, PENDEO or VAS.

The process for forming the buffer layer on a substrate of the present invention will be described in detail.

First, a sapphire substrate is preferably pre-treated with gallium chloride (GaCl) at a temperature of 500 to 1,200° C.

The treated substrate is loaded in a growth area on a HVPE reactor at a temperature of 900 to 1,150° C., an excessive amount of gallium is placed in a gallium boat, and the gallium is reacted with a mix gas of HCl and $NH_3$ composed of Group III/V elements to continuously grow an undoped gallium nitride (GaN) thin film to a thickness of 5 to 25 μm through a total of three steps, thereby forming a buffer layer.

The three steps for forming the buffer layer are carried out in the range of 900 to 1,150° C. A sequential explanation of the respective steps will be given below. In a first step, the HCl and $NH_3$ are reacted as the mix gas in a ratio of 1:150 to 1:280 for 5 to 15 minutes to grow a film to a thickness of 1 to 5 μm. In a second step, HCl and $NH_3$ are reacted as the mix gas in a ratio of 1:70 to 1:150 for 15 to 25 minutes to grow a film to a thickness of 1 to 10 μm, thereby forming a nano-porous vertical film having nanoporosity (0.10 to 0.15 μm). In a third step, HCl and $NH_3$ are reacted as the mix gas in a ratio of 1:50 to 1:100 for 20 to 35 minutes to form a film to a thickness of 1 to 7 μm, the film is treated with nitride, the resulting film is treated with gallium chloride (GaCl) for 10 to 20 minutes, and the second-step is then repeated, to form a film to a thickness of 1 to 5 μm.

The nitration utilized in the third step is a well-known method in the art to grow high-quality semiconductor single crystal films. The nitration is carried out by supplying 1.4 to 2.7 L of ammonia for one hour, more specifically, by sequentially supplying ammonia gas (primary nitration), a mix gas of ammonia ($NH_3$) and hydrogen chloride (HCl), and ammonia gas (secondary nitration) to a growth film for the buffer layer.

After the formation of the buffer layer through the three steps, the resulting buffer layer is dipped in phosphoric acid ($H_3PO_4$) at a temperature of 50 to 150° C. for 10 to 330 seconds to impart surface roughness for growth of gallium nitride single crystals.

The buffer layer has a nano-porous gallium nitride vertical film structure. Thus, the gallium nitride single crystal film is grown in the form of a pillar from the vertical buffer layer, dislocation defects occur only in an area in which the substrate comes in contact with GaN, thus reducing overall dislocation defect density. In addition, the buffer layer serves as an interlayer buffer film due to the nano-porous structure, thus offsetting the differences in thermal expansion coefficient and lattice constant between film materials of the sapphire substrate and gallium nitride.

The formation of the nano-porous vertical structure of the buffer layer allows for reduction of overall dislocation density to $5\times10^{5-6}/cm^2$, enabling formation of bulk gallium nitride single crystal films having a thickness of 20 (μm) to several millimeters (mm) without causing warping or cracks. Accordingly, when LLO is applied in a subsequent process, the sapphire is readily separated from gallium nitride, providing commercially available high-quality bulk free standing gallium nitride single crystal substrates which may be utilized in applications including high-power requiring electric devices such as high electron mobility transistors (HEMT) and hetero-junction bipolar transistors (HBT), and light-emitting diodes (LEDs) and laser diodes (LDs) for illumination.

Furthermore, as mentioned above, when pillar-shape gallium nitride single crystals are grown on the buffer layer to a thickness of 20 to 300 μm, a decreased amount of $NH_3$ and an increased amount of GaCl are secondarily supplied for 4 to 6 hours such that a volume ratio of $NH_3$ and GaCl is adjusted to 1:1 to 5:1. In this case, as GaCl is present in an increased amount, GaN is further grown on the side, thus enabling GaN to be grown to a thickness of 350 to 500 μm and improving crystallinity thereof.

In addition, in order to form n-type GaN single crystals, a Si-precursor gas such as silane ($SiH_4$) or dichlorosilane may be incorporated in an amount of 0.1 to 100 cc/min. At this time, a Si-doping concentration may be $1\times10^{16}$ to $10^{18}/cm^3$.

The GaN single crystal thick film of the present invention has a thickness and characteristics suitable for commercialization and is thus useful for various substrates for light-emitting devices. For example, GaN single crystal thick films of the present invention are subjected to mirror-processing, providing a GaN wafer with surface roughness of 1 to 10 Å, and enabling suitable deposition of GaN, GaInN, AlGaInN or AlGaN thin films to a thickness of 0.5 μm to several to several tens of micrometers (μm) on the GaN wafer using a MOCVD system without causing hillock.

In addition, the GaN single crystal thick film of the present invention may be used as a substrate for seeding in which GaN single crystals are regrown to a thickness of 2 mm thereon. After processing such as splicing of the regrown GaN single crystals, the substrate for seeding may be used as a GaN wafer.

EXAMPLES

Hereinafter, examples will be provided for a further understanding of the invention. The following examples are for illustrative purposes only and are not intended to limit the scope of the present invention.

Example 1

A sapphire substrate with 2 inch in diameter and 430 μm in thickness is treated with gallium chloride (GaCl) and is then loaded in a HVPE reactor whose temperature is maintained at 1,040° C., an excess of gallium is placed in a gallium boat, and HCl and $NH_3$ as a Group III/V mix gas are supplied on the substrate, to form a buffer layer.

First, HCl and $NH_3$ are reacted in a ratio of 1:220 for 10 minutes to grow a film to a thickness of 4 μm, HCl and $NH_3$ are reacted in a controlled ratio of 1:130 for 20 minutes to form a nano-porous vertical film to a thickness of 9 μm, HCl and $NH_3$ are reacted in a ratio of 1:80 for 30 minutes to grow a film to a thickness of 7 μm, the resulting film is nitrated by introducing ammonia gas and is then treated with GaCl for 20 minutes, HCl and $NH_3$ are reacted in a ratio of 1:130 for 15 minutes to grow a film to a thickness of 5 μm, to form a buffer layer having a total thickness of 25 μm. Whether or not the buffer layer thus formed has a vertical structure is confirmed using an optical microscope and the result thus obtained is shown in FIG. 1.

As shown in FIG. 1, the sapphire substrate provided with a nanoporous vertical film having nanoporosity of 0.10 to 0.15 μm, serving as the buffer layer, is dipped in phosphoric acid ($H_3PO_4$) at 120° C. for 5 minutes, HCl and $NH_3$ are reacted in a ratio of 1:8 for 30 minutes, while maintaining the temperature of the reactor to grow gallium nitride, HCl and $NH_3$ are reacted in a ratio of 1:1 for 6 hours to grow gallium nitride thereon, and 5 cc/min of dichlorosilane is supplied thereto, thereby forming an n-type gallium nitride (n-GaN) single crystal film with a total thickness of 500 μm. The GaN single crystal thick film thus obtained is separated from sapphire to obtain a free standing GaN single crystal film.

For the free standing GaN single crystal film thus obtained, crystallinity (FWHM), dislocation defect density and presence of cracks are confirmed by double-crystal X-ray diffraction (DXRD), photo luminescence (PL) and optical microscopy. The results thus obtained are shown in Table 1 below.

TABLE 1

| Physical Property | Example 1 |
|---|---|
| FWHM of DCRC (ω-scan) | <100 arcsec |
| Dislocation Density in GaN | <$10^5$/$cm^2$ |
| Thickness Uniformity | ±5% |
| Crack | Not present |

As can be seen from FIG. 1, by forming a nanoporous vertical film serving as the buffer layer on the sapphire substrate and growing gallium nitride single crystals thereon, the crystals are grown to a sufficient thickness of 500 μm or higher, are almost free from cracks, have a low dislocation defect density of $1 \times 10^5$/$cm^2$ or less and exhibit superior crystallinity.

As apparent from the above description, the present invention provides a method for forming a buffer layer, to grow high-quality gallium nitride single crystals, advantageously capable of reducing tensile stress generated by the difference in thermal expansion coefficient between gallium nitride and the sapphire substrate, growing a gallium nitride layer to a thickness of 1 micrometer (μm) to several millimeters (mm) without causing cracks, and reducing the lattice constant difference to improve crystallinity.

Furthermore, in accordance with the method, crystals are grown on the substrate provided with the buffer layer, thus enabling manufacture of high-quality bulk free standing gallium nitride single crystal substrates with a thickness of 300 μm to 550 μm suitable for commercialization.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a buffer layer for growing gallium nitride single crystals on a sapphire substrate using hydride vapor phase epitaxy (HVPE), wherein the buffer layer is formed in the form of an undoped vertical gallium nitride (GaN) single crystal film with a nanoporosity of 0.10 to 0.15 μm on the sapphire substrate by reacting HCl and $NH_3$ as a Group III/V mix gas, wherein the method comprises:
first reacting HCl and $NH_3$ as the mix gas in a ratio of 1:220 to 1:280 for 5 to 15 minutes to grow a film of a thickness of 1 to 5 μm;
second reacting HCl and $NH_3$ as the mix gas in a ratio of 1:130 to 1:150 for 15 to 25 minutes to grow a film of a thickness of 1 to 10 μm, thereby forming a nano-porous vertical film with nanoporosity of 0.10 to 0.15 μm;
third reacting HCL and $NH_3$ as the mix gas in a ratio of 1:80 to 1:100 for 20 to 35 minutes to grow a film of a thickness of 1 to 7 μm;
treating the film grown by the third reaction of HCl and $NH_3$ with nitride;
treating the film treated with nitride with gallium chloride (GaCl) for 10 to 20 minutes; and
repeating the previous second reaction of HCl and $NH_3$ to form a film to a thickness of 1 to 5 μm,
wherein the method further comprises treating the sapphire substrate with gallium chloride (GaCl) at a temperature of 500 to 1,200° C., before the formation of the buffer layer.

2. The method according to claim 1, wherein the buffer layer is formed to a total thickness of 5 to 25 μm.

3. The method according to claim 1, further comprising dipping the substrate in phosphoric acid ($H_3PO_4$) at 50 to 150° C. for 10 to 330 seconds, after the formation of the buffer layer.

* * * * *